(12) United States Patent
Hong et al.

(10) Patent No.: US 6,350,818 B1
(45) Date of Patent: Feb. 26, 2002

(54) ANTI REFLECTIVE COATING POLYMERS AND THE PREPARATION METHOD THEREOF

(75) Inventors: Sung-Eun Hong, Seongnam-shi; Min-Ho Jung, Yicheon-shi; Hyeong-Soo Kim, Yicheon-shi; Ki-Ho Baik, Yicheon-shi, all of (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/413,679

(22) Filed: Oct. 7, 1999

(30) Foreign Application Priority Data

Dec. 31, 1998 (KR) .............................. 98-63695

(51) Int. Cl.$^7$ ................................. C08F 8/34
(52) U.S. Cl. .................. 525/328.8; 525/344; 525/504
(58) Field of Search ............... 525/328.8, 344, 525/504, 505; 526/287

(56) References Cited

U.S. PATENT DOCUMENTS

| | | | | |
|---|---|---|---|---|
| 4,681,923 A | * | 7/1987 | Demmer | 525/504 |
| 4,822,718 A | | 4/1989 | Latham et al. | 430/271 |
| 4,839,253 A | * | 6/1989 | Demmer | 522/166 |
| 5,674,648 A | | 10/1997 | Brewer et al. | 430/18 |

FOREIGN PATENT DOCUMENTS

JP 5188588 * 7/1993

\* cited by examiner

*Primary Examiner*—Christopher Henderson
(74) *Attorney, Agent, or Firm*—Townsend and Townsend and Crew LLP

(57) ABSTRACT

The present invention relates to organic anti-reflective coating polymers and preparation methods therefor. Anti-reflective coatings are used in a semiconductor device during photolithography processes to prevent the reflection of light from lower layers of the device, or resulting from changes in the thickness of the photoresist layer, and to eliminate the standing wave effect when ArF light is used. The present invention also relates to anti-reflective compositions and coatings containing these organic anti-reflective coating polymers, alone or in combination with certain light-absorbing compounds, and preparation methods therefor. When the polymers of the present invention are used in an anti-reflective coating in a photolithography process for forming submicro-patterns, the resultant elimination of changes in CD due to diffractive and reflective lights originating from lower layers increases the product yield in the formation of submicro-patterns during the manufacture of 64 M, 256 M, 1G, 4G and 16G DRAM semiconductor devices.

9 Claims, No Drawings

ANTI REFLECTIVE COATING POLYMERS AND THE PREPARATION METHOD THEREOF

BACKGROUND OF THE INVENTION

1. Field of the Invention

The present invention relates to organic polymers suitable for use in anti-reflective coatings on semiconductor devices, and methods for preparing them. More specifically, the polymers of the present invention can be used to form a layer which prevents the reflection of light from lower layers coated on a semiconductor chip when photolithography processes using short wavelength light sources, such as 248 nM (KrF) and 193 nm (ArF) wavelengths, are employed during the manufacture of 64M, 256M, 1G, 4G and 16G DRAM semiconductor devices. Anti-reflective coatings comprising polymers of the present invention also eliminate the standing wave effect when an ArF beam is used, and reflection/diffraction caused by changes in the thickness of the photoresist layer itself. The present invention also relates to an anti-reflective composition containing these polymers, alone or in combination with other light-absorbing compounds, and the anti-reflective coating formed from these compositions, as well as preparation methods therefor.

2. Description of the Prior Art

In photolithography processes for forming submicro-patterns during the manufacture of semiconductors, it is unavoidable to have reflective notching of the standing wave of the exposing radiation. This effect is due to the spectroscopic properties of the lower layers coated on the semiconductor wafer, changes in the photoresist layer and variations in the critical dimension (CD) due to diffracted and reflected light from the lower layer. Therefore, it has been suggested that a layer, called an anti-reflective coating, be introduced into the semiconductor device to prevent the reflection of light from the lower layers. This anti-reflective coating usually comprises an organic material that absorbs light in the wavelength range of the light beam source used in the lithography process.

Anti-reflective coatings are categorized into inorganic and organic anti-reflective coatings depending on the coating materials used, or into light-absorbing and light-interfering coatings depending on the mechanism.

An inorganic anti-reflective coating is used mainly in the process of submicro-pattern formation using i-line radiation with a wavelength of 365 nm. TiN and amorphous carbon have been widely used in light-absorbing coatings, and SiON has been used in light-interfering coatings.

Inorganic SiON has been used for anti-reflective coatings in submicro-pattern formation processes using a KrF beam,. A recent trend has been to try to use organic compounds in an anti-reflective coating. Based on knowledge to date, the following are prerequisites for an adequate organic anti-reflective coating:

First, during the pattern formation process, the photoresist must not be peeled from the substrate by dissolving in the solvent used in the organic anti-reflective coating. For this reason, the organic anti-reflective coating needs to be designed to form a cross-linked structure, and must not produce chemicals as a by-product.

Second, acid or amine compounds must not migrate in or out of the anti-reflective coating. This is because there is a tendency for "undercutting" at the lower side of the pattern if an acid migrates, and for "footing" if a base such as an amine migrates.

Third, the anti-reflective coating must have a faster etching speed compared to the photoresist layer so that the etching process can be performed efficiently by utilizing the photoresist layer as a mask.

Fourth, the anti-reflective coating must function with a minimal thickness.

Up to now, suitable anti-reflective coatings have not been developed for use in processes for forming a submicro-pattern using an ArF beam. Furthermore, since there is no known inorganic anti-reflective coating which controls the interference from a 193 nm light source, the use of organic chemicals in anti-reflective coatings is currently being studied.

Therefore, it is desirable to use and develop organic anti-reflective coatings that absorb light strongly at specific wavelengths to prevent the standing wave effect and light reflection in lithography processes, and to eliminate the rear diffraction and reflected light from the lower layers.

SUMMARY OF THE INVENTION

The present invention provides novel chemical compounds suitable for use in anti-reflective coatings in photolithography processes for forming submicro-patterns sing 193 nm (Arf) and 248 nm (KrF) light beams in the manufacture of semiconductor devices.

The present invention further provides preparation methods for chemical compounds to be used in anti-reflective coatings.

The present invention also provides anti-reflective coating compositions containing the above-mentioned compounds and preparation methods thereof.

The present invention also provides anti-reflective coatings formed by using the above-mentioned anti-reflective composition, and methods for the formation thereof.

DETAILED DESCRIPTION OF THE INVENTION

Polymers of the present invention are selected from the group consisting of compounds represented by the following general formulas (1), (2) and (3):

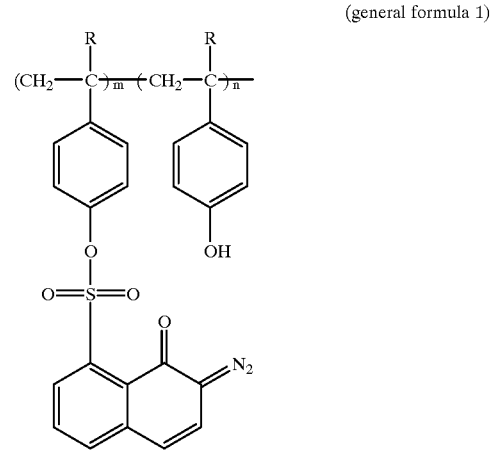

(general formula 1)

wherein, R is hydrogen, a $C_1$–$C_6$ alkyl group, hydroxy or hydroxymethyl; and m:n is the mole ratio of 0.1–0.9:0.1–0.9;

(general formula 2)

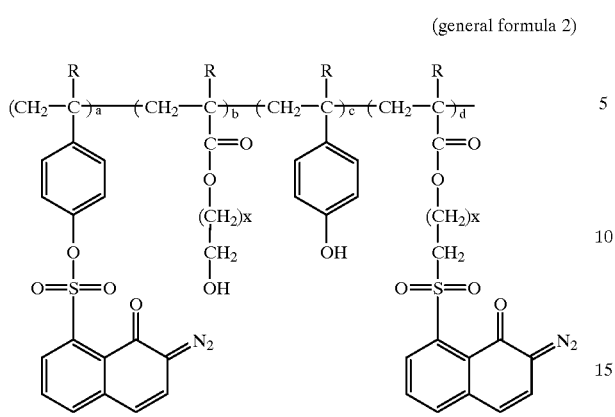

wherein, R is hydrogen, a $C_1$–$C_6$ alkyl group, hyrdoxy or hydroxymethyl; x is an number between 1 and 5; and a:b:c:d is the mole ratio of 0.1–0.9:0.1–0.9: 0.1–0.9:0.1–0.9; and (general formula 3)

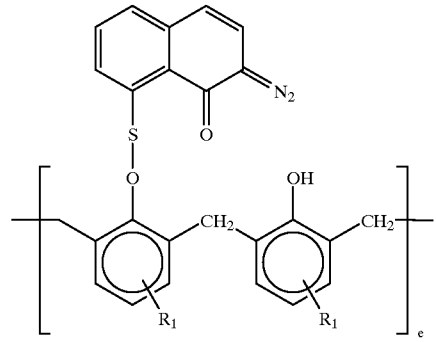

wherein, $R_1$ is hydrogen, methyl or hydroxy; and e is the average degree of polymerization. Preferably e has a value of 3.0~17.0.

The polymers of the present invention are designed to facilitate light absorption at wavelengths of 193 nm and 248 nm by having groups that absorbs light strongly at both wavelengths, The polymers represented by general formula 1 above can be prepared in accordance with the reaction equation 1 set forth below, wherein polyhydroxystyrene resin (Compound I) and diazonaphthoquinone halide (Compound II) are reacted in a solvent in the presence of an amine:

(reaction equation 1)

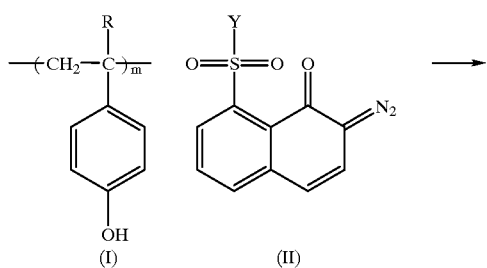

-continued

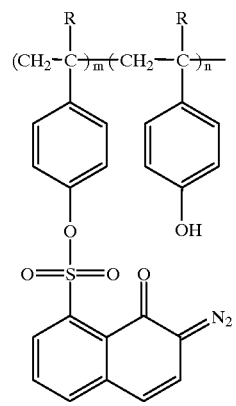

wherein, R is hydrogen, a $C_1$–$C_6$ alkyl group, hydroxy or hydroxymethyl; Y is a halogen group; and m: n is the mole ratio of 0.1–0.9: 0.1–0.9.

The polymer represented by the general formula 2 above can be prepared in accordance with reaction equation 2 set forth below, wherein poly(styrene-acrylate) resin (Compound III) and diazonaphthoquinone halide (Compound II) are reacted in a solvent in the presence of an amine:

(reaction equation 2)

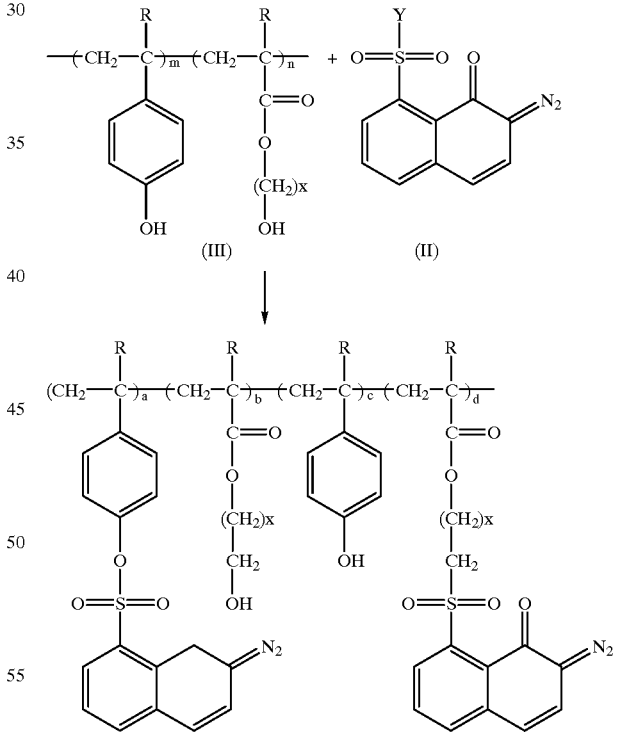

wherein, R is hydrogen, a $C_1$–$C_6$ alkyl group, hydroxy or hydroxymethyl; Y is a halogen group; x is an number from 1 to 5; and a:b:c:d is the mole ratio of 0.1–0.9:0.1–0.9:0.1–0.9:0.1–0.9.

The polymer represented by general formula 3 above can be prepared in accordance with reaction equation 3 set forth below, wherein novolac resin (Compound IV) and diazonaphthoquinone halide (Compound II) are reacted in a solvent in the presence of an amine:

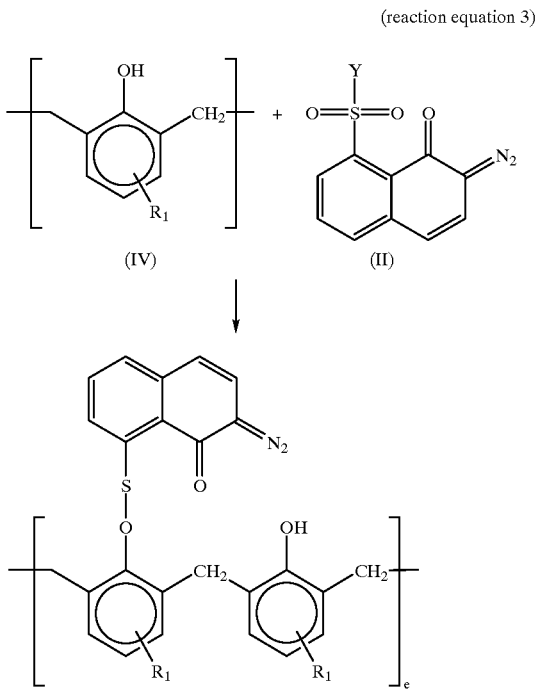

(reaction equation 3)

wherein, $R_1$ is hydrogen, methyl or hydroxy; Y is a halogen group; and e is the average degree of polymerization. The raw materials used in the above reactions, polyhydroxystyrene (I), diazonaphthoquinone halide (II), poly(styrene-acrylate) resin (III) and novolac resin (IV), are commercially available or can be synthesized by known methods.

The amine used in preparing the polymers of the present invention is preferably trialkylamine, and more preferably triethylamine.

The solvent used in preparing the polymers of the present invention may be selected from the group consisting of tetrahydrofuran, toluene, benzene, methylethylketone and dioxane.

The reaction temperature of the polymerization process used for preparing the polymers of the present invention is preferably between 50 and 80° C.

The present invention also provides an anti-reflective coating composition containing a polymer of the general formula 1, 2 or 3 alone in an organic solvent.

Anti-reflective coating composition of the present invention may also comprise one of the polymers of general formula 1, 2 or 3 and a light absorbing compound selected from the group consisting of anthracene and its derivatives, fluorenone derivatives, fluorene and its derivatives, fluorenol, xanthone, quinazarin and fluorescein. Examples of such compounds are listed in Tables 1 a and 1b below:

TABLE 1a

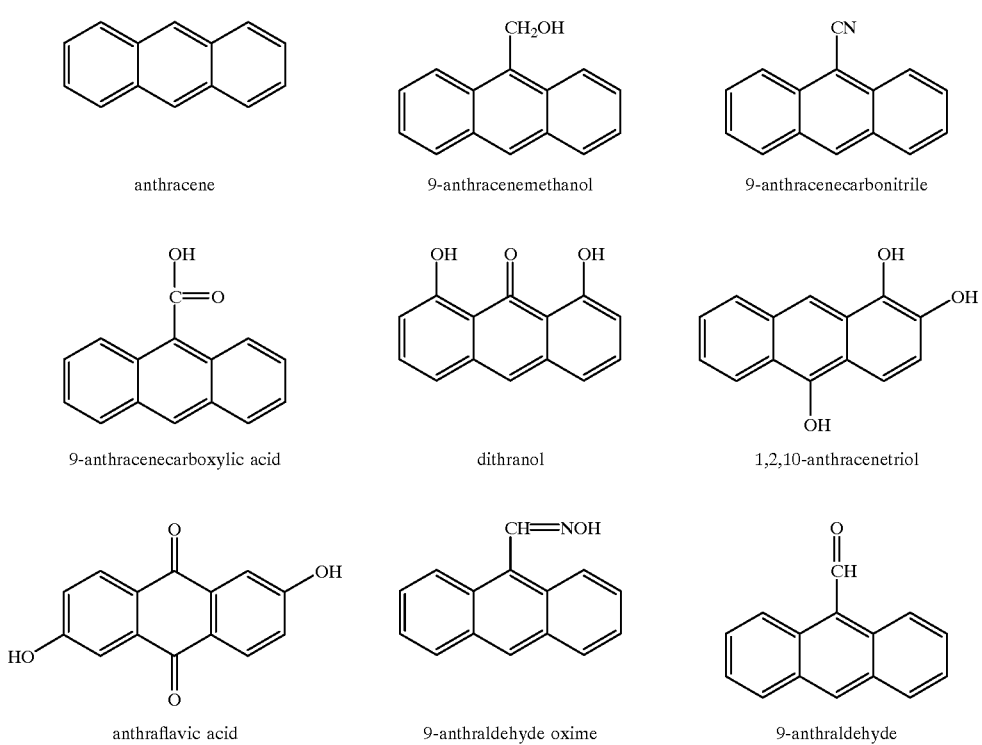

TABLE 1a-continued

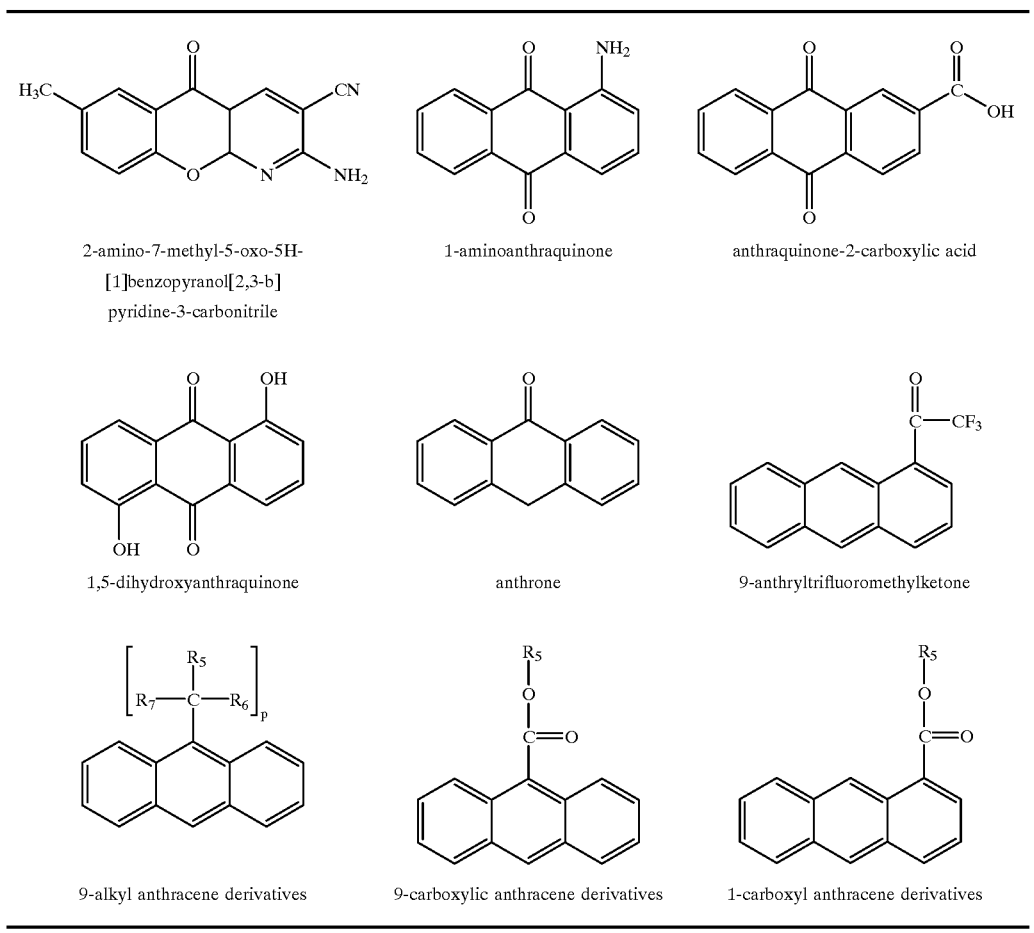

2-amino-7-methyl-5-oxo-5H-[1]benzopyrano[2,3-b]pyridine-3-carbonitrile 1-aminoanthraquinone anthraquinone-2-carboxylic acid 1,5-dihydroxyanthraquinone anthrone 9-anthryltrifluoromethylketone 9-alkyl anthracene derivatives 9-carboxylic anthracene derivatives 1-carboxyl anthracene derivatives TABLE 1b

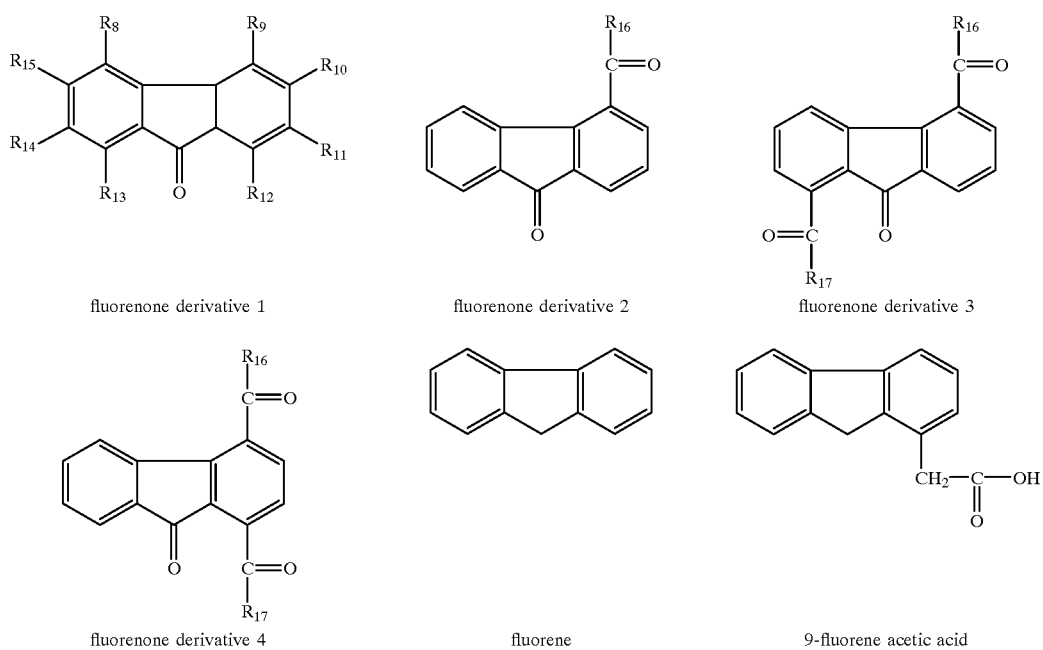

fluorenone derivative 1 fluorenone derivative 2 fluorenone derivative 3 fluorenone derivative 4 fluorene 9-fluorene acetic acid

TABLE 1b-continued

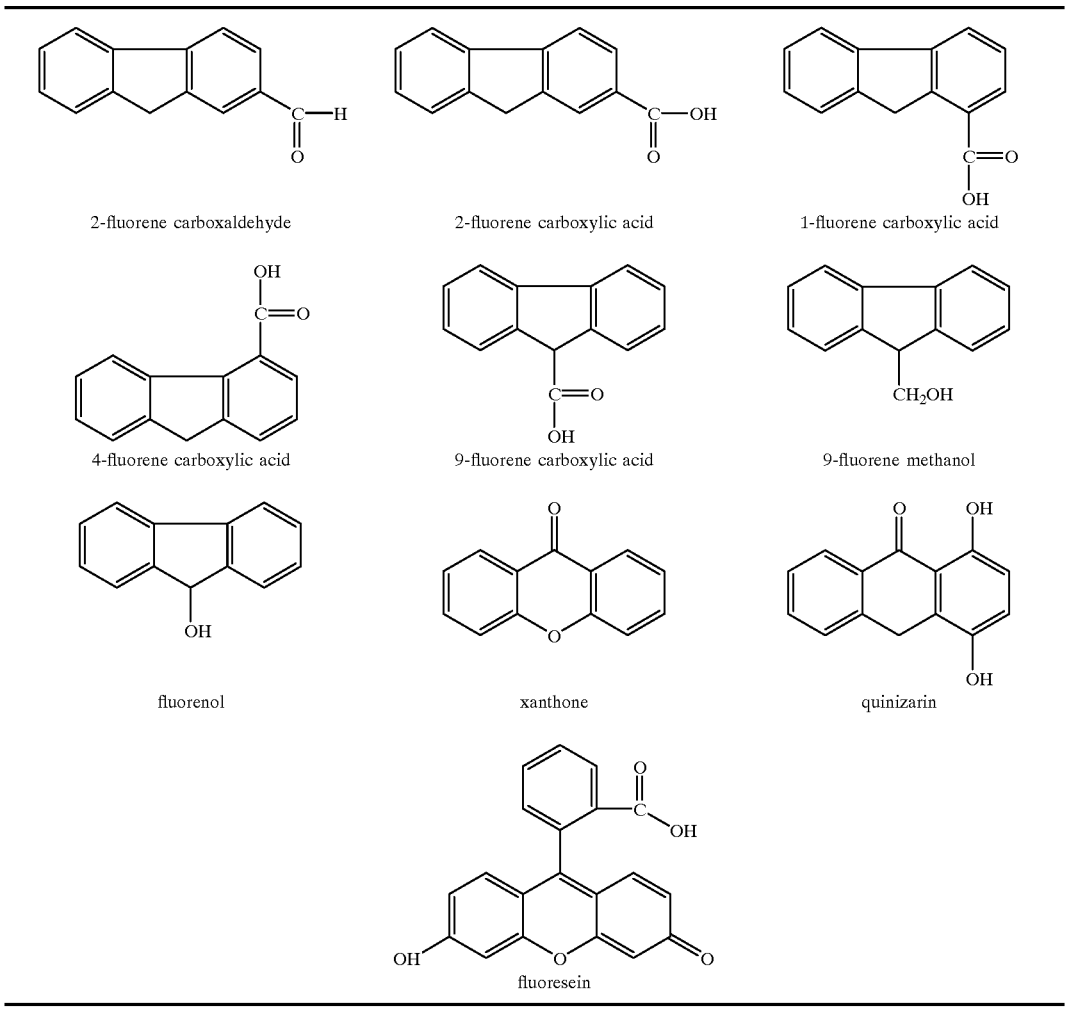

In Table 1a above, $R_5$, $R_6$ and $R_7$ each represent independently hydrogen, a substituted or non-substituted straight or branched $C_1$–$C_5$ alkyl group, cycloalkyl, alkoxyalkyl or cycloalkoxyalkyl, and p is an integer. Preferably P has a value of 1~3.

In Table 1b above, $R_8$–$R_{15}$ each represent independently hydrogen, hydroxy, substituted or non-substituted straight or branched $C_1$–$C_5$ alkyl, cycloalkyl, alkoxyalkyl or cycloalkoxyalkyl, and $R_{16}$ and $R_{17}$ each independently represent an alkyl group.

The anti-reflective coating composition of the present invention is prepared by dissolving a polymer of general formula 1, 2 or 3 above in an organic solvent, and subsequently adding thereto one or more compounds selected from the above Tables 1a and 1b.

The organic solvent used for the preparation can be any suitable conventional organic solvent, preferably a solvent selected from the group consisting of ethyl 3-ethoxypropionate, methyl 3-methoxypropionate, cyclohexanone, propylene glycol and methyletheracetate.

The amount of the solvent used in preparing the anti-reflective coating composition according to the present invention is preferably 200–5000% (w/w) with respect to the weight of the polymer used.

An anti-reflective coating of the present invention can be provided on a semiconductor silicon wafer by filtering a solution of a polymer of general formula 1, 2 or 3 alone, or a composition containing a polymer of general formula 1, 2 or 3 and one or more of the light-absorbing compounds set forth in Tables 1a and 1b, subsequently coating the filtered solution or composition on a wafer that has been prepared in the conventional manner and "hard-baking" the coating (heating the wafer to a temperature of 100–300° C. for 10–1000 seconds) to cross-link the anti-reflective coating polymer.

The polymers comprising the anti-reflective coating of the present invention form a cross-linked structure when they are coated on a wafer and baked at high temperatures ("hard-baked") through a reaction which opens the ring of the diazonaphthoquinone group in said polymers. This cross-linked structure allows the polymers of the present invention to form an organic anti-reflective coating material which is spectroscopically stable under conventional photolithographic conditions.

The polymers and compositions of the present invention have proven to be excellent organic anti-reflective coating materials during the formation of submicro-patterns in photolithographic processes using 248 nm KrF and 193 nm ArF 1lasers. The anti-reflective effect provided in accordance with the present invention have also been found to be superior when E-beam, extreme ultraviolet (EUV) light, and ion beam light sources are used instead of an ArF beam.

The invention will be further illustrated by the following examples, but the invention is not limited to the examples given.

EXAMPLE 1

Synthesis of Copolymer of Polyhydroxystyrene having a Diazonaphthoquinonesulfonyl Group.

After dissolving completely 49.6 g (0.3 moles) of polyhydroxystyrene resin in a 300 ml round bottomed flask containing 250 g of tetrahydrofuran (THF), 15.2 g (0.15 moles) of triethylamine is added to the mixture and mixed completely. Into the mixture, 45.1 g (0.15 moles) of diazonaphthoquinone chloride is added slowly and reacted for more than 24 hours. After the completion of the reaction, the resin is separated by precipitating it in diethylether and dried under vacuum to obtain a poly(hydroxystyrene-diazonaphthoquinonesulfonylstyrene) copolymer of the present invention wherein 50% of hydroxystyrene monomer is substituted with a diazonaphthoquinonesulfonyl group. The yield is 90–95%.

EXAMPLE 2

Synthesis of Copolymer of Polyhydroxymethylstyrene having a Diazonaphthoquinonesulfonyl Group.

After dissolving completely 58.8 g (0.33 moles) of poly(hydroxy-(methylstyrene)) resin in a 300 ml round bottomed flask containing 250 g of tetrahydrofuran (THF), 13.45 g (0.132 moles) of triethylamine is added to the mixture and mixed completely. Into the mixture, 39.7 g (0.132 moles) of diazonaphthoquinone chloride is added slowly and reacted for more than 24 hours. After the completion of the reaction, the resin is separated by precipitating it in diethylether and dried under vacuum to obtain a poly(hydroxymethylstyrene-diazonaphthoquinonesulfonyl-(methylstyrene) copolymer of the present invention wherein 40% of the hydroxy-methylstyrene monomer is substituted with a diazonaphthoquinonesulfonyl group. The yield is 90–95%.

EXAMPLE 3

Synthesis of Copolymer of Poly(hydroxystyrene-hydroxyethylacrylate) having a Diazonaphthoquinonesulfonyl Group.

After dissolving completely 84.1 g (0.3 moles) of poly(hydroxystyrene-hydroxyethylacrylate) resin in a 300 ml round bottomed flask containing 300 g of tetrahydrofuran (THF), 15.2 g (0.15 moles) of triethylamine is added to the mixture and mixed completely. Into the mixture, 45.1 g (0.15 moles) of diazonaphthoquinone chloride is added slowly and reacted for more than 24 hours. After the completion of the reaction, the resin is separated by precipitating it in diethylether and dried under vacuum to obtain a poly(hydroxystyrene-hydroxyethylacrylate) copolymer of the present invention wherein 50% of reactant is substituted with a diazonaphthoquinonesulfonyl group. The yield is 85–90%.

EXAMPLE 4

Synthesis of Copolymer of Poly(hydroxystyrene-hydroxyethylmethacrylate) having a Diazonaphthoquinonesulfonyl Group.

After dissolving completely 88.3 g (0.3 moles) of poly(hydroxystyrene-hydroxyethylmethacrylate) resin in a 300 ml round bottomed flask containing 300 g of tetrahydrofuran (THF), 13.7 g (0.135 moles) of triethylamine is added to the mixture and mixed completely. Into the mixture, 40.6 g (0.135 moles) of diazonaphthoquinone chloride is added slowly and reacted for more than 24 hours. After the completion of the reaction, the resin is separated by precipitating it in diethylether and dried under vacuum to obtain a hydroxystyrene-hydroxyethylnethacrylate resin of the present invention wherein 45% of the reactant is substituted with a diazonaphthoquinonesulfonyl group. The yield is 90–95%.

EXAMPLE 5

Synthesis of Phenylnovolac Copolymer having a Diazonaphthoquinonesulfonyl Group.

After dissolving completely 63.1 g (0.35 moles) of phenylnovolac resin in a 300 ml round bottomed flask containing 250 g of tetrahydrofuran (THF), 17.7 g (0.175 moles) of triethylamine is added to the mixture and mixed completely. Into the mixture, 52.6 g (0.175 moles) of diazonaphthoquinone chloride is added slowly and reacted for more than 24 hours. After the completion of the reaction, the resin is separated by precipitating it in diethylether and dried under vacuum to obtain a phenylnovolac resin of the present invention wherein 50% of the reactant is substituted with a diazonaphthoquinonesulfonyl group. The yield is 90–95%.

EXAMPLE 6

Synthesis of Cresolnovolac Copolymer having a Diazonaphthoquinonesulfonyl Group.

After dissolving completely 62.2 g (0.3 moles) of cresolnovolac resin in a 300 ml round bottomed flask containing 250 g of tetrahydrofuran (THF), 15.2 g (0.15 moles) of triethylamine is added to the mixture and mixed completely. Into the mixture, 45.1 g (0.15 moles) of diazonaphthoquinone chloride is added slowly and reacted for more than 24 hours. After the completion of the reaction, the resin is separated by precipitating it in diethylether and dried under vacuum to obtain a cresolnovolac resin of the present invention wherein 50% of the reactant is substituted with a diazo-naphthoquinonesulfonyl group. The yield is 90–95%.

EXAMPLE 7

Preparation of Anti-reflective Coating Film 50 mg of a Copolymer prepared in accordance with Examples 1 through 6 above is mixed with 0.1–30%(w/w) of one of the compounds in Tables 1a and 1b above in about 100 g of propylene glycol methyletheracetate (PGMEA) and the mixture is dissolved completely. The solution is filtered, coated on a wafer and hard-baked at 100–300 ° C. for 10–1000 seconds. Afterwards, a light-sensitive film is coated on this anti-reflective film to provide a semiconductor device suitable for fine pattern formation in a conventional photolithographic process.

The polymers of the present invention have high solubilities in most of the hydrocarbon solvents, but the anti-reflective coating is rendered insoluble in any solvent after hard-baking. Accordingly, the polymers of the present invention are superior for use in a photoresist film and do not exhibit problems such as cutting or footing during the pattern formation.

When the polymers of the present invention are used as anti-reflective coatings in the submicro-pattern formation process of preparing semiconductors, the product yield is increased because the elimination of the CD variation originating from lower layers forms stable 64 M, 256 M, 1G, 4G, 16G DRAM submicro-patterns.

What is claimed is:

1. A diazonapthoquinonesulfonyl-substituted polymer suitable for use in an anti-reflective coating of a semiconductor device, said polymer being selected from the group consisting of:

(a) polyhydroxystyrene polymers having the formula:

(general formula 1)

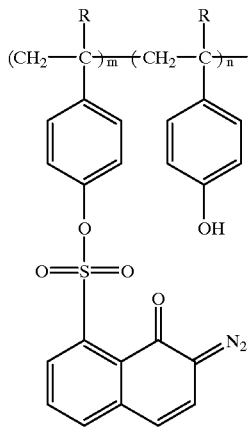

wherein R is hydrogen, a $C_1$–$C_6$ alkyl group, hydroxy or hydroxymethyl; and m:n is the mole ratio of 0.1–0.9:0.1–0.9;

(b) poly(styrene-acrylate) polymers having the formula:

(general formula 2)

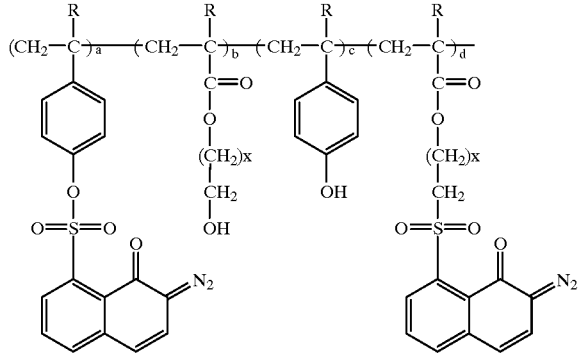

wherein R is hydrogen, an $C_1$–$C_6$ alkyl group, hydroxy or hydroxymethyl; x is a number from 1 and 5; and a:b:c:d is the mole ratio of 0.1–0.9:0.1–0.9:0.1–0.9:0.1–0.9; and (c) novolac polymers having the formula:

(general formula 3)

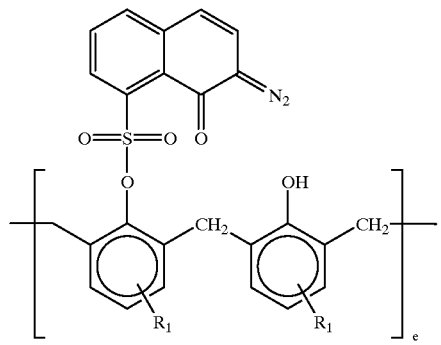

wherein $R_1$ is hydrogen, methyl or hydroxy; and e is the average degree of polymerization.

2. A polymer according to the claim 1, wherein R is hydrogen or methyl, $R_1$ is hydrogen or methyl, and x is 1.

3. A process of preparing a polymer of claim 1 which comprises reacting a polyhydroxystyrene resin (I) and a diazonaphthoquinone halide (II) in a solvent in the presence of an amine, as shown in the following reaction equation:

(reaction equation 1)

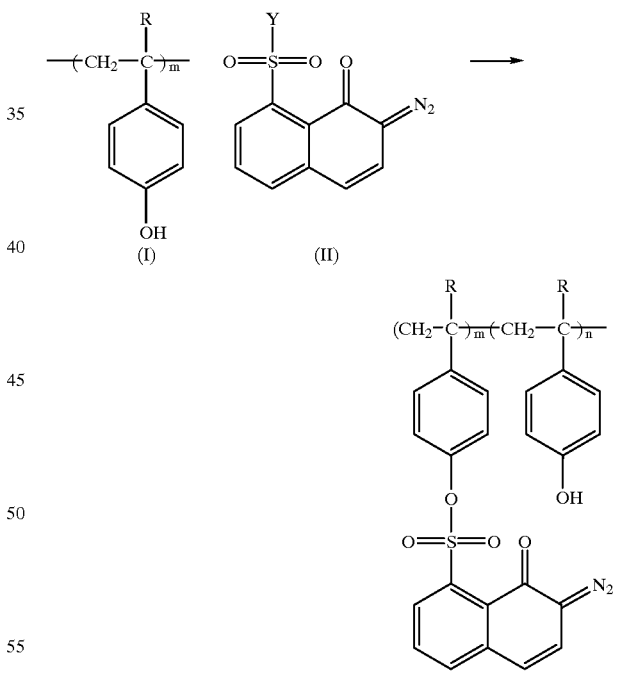

wherein R is hydrogen, a $C_1$–$C_6$ alkyl group, hydroxy or hydroxymethyl; Y is a halogen; and m:n is the mole ratio of 0.1–0.9:0.1–0.9.

4. A process of preparing a polymer of claim 1 which comprises reacting a poly(styrene-acrylate) resin (III) and a diazonaphthoquinone halide (II) in a solvent in the presence of an amine, as shown in the following reaction equation:

(reaction equation 2)

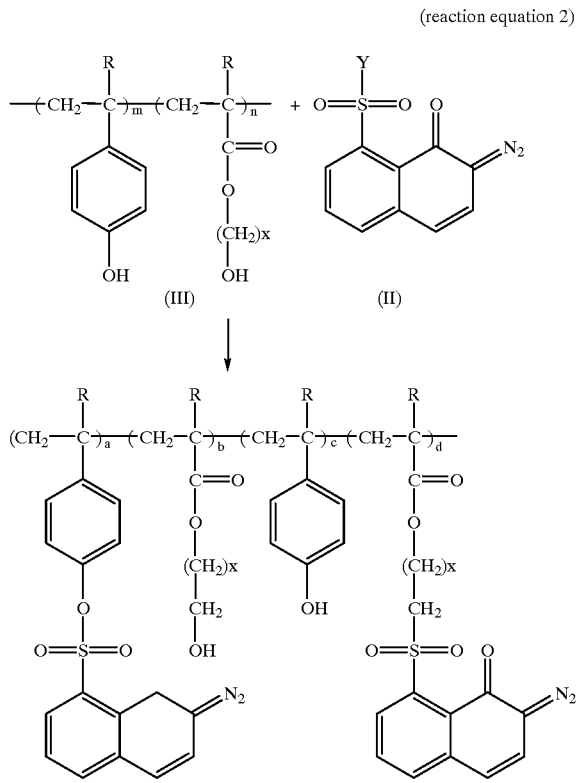

wherein R is hydrogen, an $C_1$–$C_6$ alkyl group, hydroxy or hydroxymethyl; Y is a halogen, x is a number from 1 and 5; and a:b:c:d is the mole ratio of 0.1–0.9:0.1–0.9:0.1–0.9:0.1–0.9.

5. A process of preparing a polymer of claim 1 which comprises reacting a novolac resin (IV) and diazonaphthoquinone halide (II) in a solvent in the presence of an amine as shown below in the following reaction equation:

(reaction equation 3)

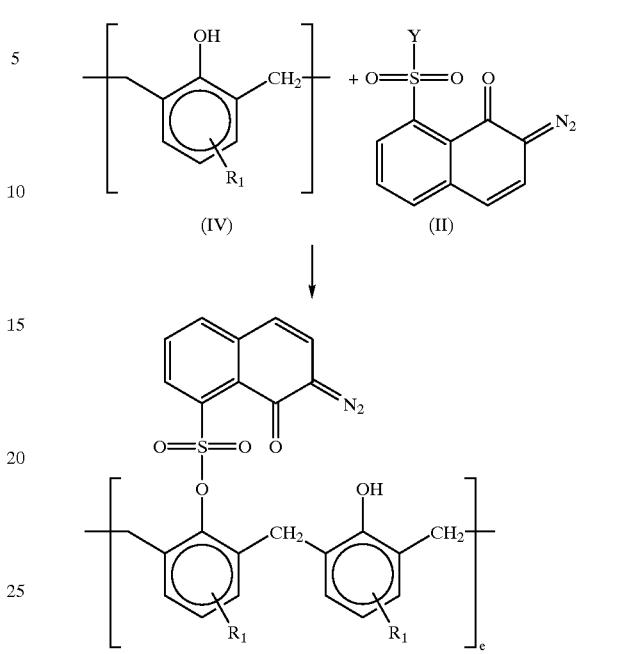

wherein, R is hydrogen, methyl or hydroxy; Y is a halogen; and e is the average degree of polymerization.

6. A process according to claim 3, 4 or 5 wherein the mole ratio of each reactant is 0.1–0.9.

7. A process according to claim 3, 4 or 5 wherein the amine is a triethylamine.

8. A process according to claim 3, 4 or wherein the solvent is selected from the group consisting of tetrahydrofuran, toluene, benzene, methylethylketone and dioxane.

9. A process according to claim 3, 4 or wherein the reaction temperature is between 50 and 80° C.

* * * * *